(12) United States Patent
Pesetski et al.

(10) Patent No.: US 7,714,386 B2
(45) Date of Patent: May 11, 2010

(54) CARBON NANOTUBE FIELD EFFECT TRANSISTOR

(75) Inventors: Aaron Anthony Pesetski, Gamgrills, MD (US); Hong Zhang, Gamgrills, MD (US); John Douglas Adam, Millersville, MD (US); John Przybysz, Severna Park, MD (US); Jim Murduck, Ellicott City, MD (US); Norman Goldstein, Ellicott City, MD (US); James Baumgardner, Ellicott City, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 1006 days.

(21) Appl. No.: 11/449,758

(22) Filed: Jun. 9, 2006

(65) Prior Publication Data

US 2009/0224230 A1    Sep. 10, 2009

(51) Int. Cl.
   *H01L 27/01* (2006.01)
(52) U.S. Cl. ......................... 257/347; 257/40
(58) Field of Classification Search ................ 257/288, 257/347, 365, 366, 410, 40
   See application file for complete search history.

(56) References Cited
   U.S. PATENT DOCUMENTS

| | | | |
|---|---|---|---|
| 6,590,231 B2 | 7/2003 | Watanabe et al. | |
| 6,706,566 B2 | 3/2004 | Avouris et al. | |
| 6,740,910 B2 | 5/2004 | Roesner et al. | |
| 6,852,582 B2 | 2/2005 | Wei et al. | |
| 6,891,227 B2 | 5/2005 | Appenzeller et al. | |
| 6,972,467 B2 * | 12/2005 | Zhang et al. | 257/401 |
| 2002/0024099 A1 | 2/2002 | Watanabe et al. | |
| 2002/0173083 A1 | 11/2002 | Avouris et al. | |
| 2003/0132461 A1 | 7/2003 | Roesner et al. | |
| 2003/0178617 A1 | 9/2003 | Appenzeller et al. | |
| 2004/0036128 A1 | 2/2004 | Zhang et al. | |
| 2004/0144972 A1 | 7/2004 | Dai et al. | |
| 2004/0224490 A1 | 11/2004 | Wei et al. | |
| 2004/0238887 A1 | 12/2004 | Nihey | |
| 2005/0012163 A1 | 1/2005 | Wei et al. | |
| 2005/0056826 A1 | 3/2005 | Appenzeller et al. | |

* cited by examiner

*Primary Examiner*—Mark Prenty
(74) *Attorney, Agent, or Firm*—Andrews Kurth LLP

(57) ABSTRACT

A carbon nanotube field effect transistor includes a substrate, a source electrode, a drain electrode and a carbon nanotube. The carbon nanotube forms a channel between the source electrode and the drain electrode. The carbon nanotube field effect transistor also includes a gate dielectric and a gate electrode. The gate electrode is separated from the carbon nanotube by the gate dielectric, and an input radio frequency voltage is applied to the gate electrode.

15 Claims, 9 Drawing Sheets

US 7,714,386 B2

CARBON NANOTUBE FIELD EFFECT TRANSISTOR

TECHNICAL FIELD

The invention relates to transistors, specifically to field effect transistors fabricated using carbon nanotubes.

BACKGROUND

Carbon nanotubes (CNTs) are long, thin cylindrical carbon molecules with novel properties, making them potentially useful in a wide variety of applications (e.g., nano-electronics, optics, materials applications, etc.). CNTs are essentially single sheets of graphite (a hexagonal lattice of carbon) rolled into a cylinder. CNTs range from approximately 0.6 to 5 nanometers (nm) in diameter, and can be as long as a few centimeters. They exhibit extraordinary strength and unique electrical properties, and are efficient conductors of heat.

CNTs have a very broad range of electronic, thermal, and structural properties that vary based on the different kinds of nanotubes (e.g., defined by its diameter, length, and chirality, or twist). They simultaneously have the highest room-temperature mobility and saturated electron velocity of any known substance.

Conventional field effect transistors (FETs) are non-linear devices. There are two primary sources of non-linearity in conventional FETs. First, conventional FETs have a depletion region in the channel which varies in size with applied gate voltage. As a result, the gate-source capacitance varies with voltage, and charge in the channel is a non-linear function of gate voltage. Second, the carrier velocity is a non-linear function of the electric field. The combination of these two effects results in a drain current that is a non-linear function of the gate voltage.

Linear amplifiers made with conventional FETs burn a lot of power. The standard method of building linear amplifiers from conventional FETs is to use a large source-drain bias. However, the large source-drain bias can result in a large electric field along the length of the channel. As carriers flow down the channel, they gain sufficient energy to stimulate optical phonons. As a result, the carrier velocity saturates and becomes nearly independent of the source-drain and gate biases. However, the total charge in the channel is still a nonlinear function of the gate voltage. The gate bias is then chosen at a point where the second and/or third derivatives of the drain current are minimized. This point varies with device geometry. This approach minimizes the non-linearity of the FET in that it maximizes the second and/or third order intercepts, but a large source-drain voltage is required and a significant amount of power is dissipated generating optical phonons.

SUMMARY

A carbon nanotube field effect transistor includes a substrate, a source electrode, a drain electrode and a carbon nanotube. The carbon nanotube forms a channel between the source electrode and the drain electrode. The carbon nanotube field effect transistor also includes a gate dielectric and a gate electrode. The gate electrode is separated from the carbon nanotube by the gate dielectric, and an input radio frequency voltage is applied to the gate electrode.

DETAILED DESCRIPTION

Figure 1:
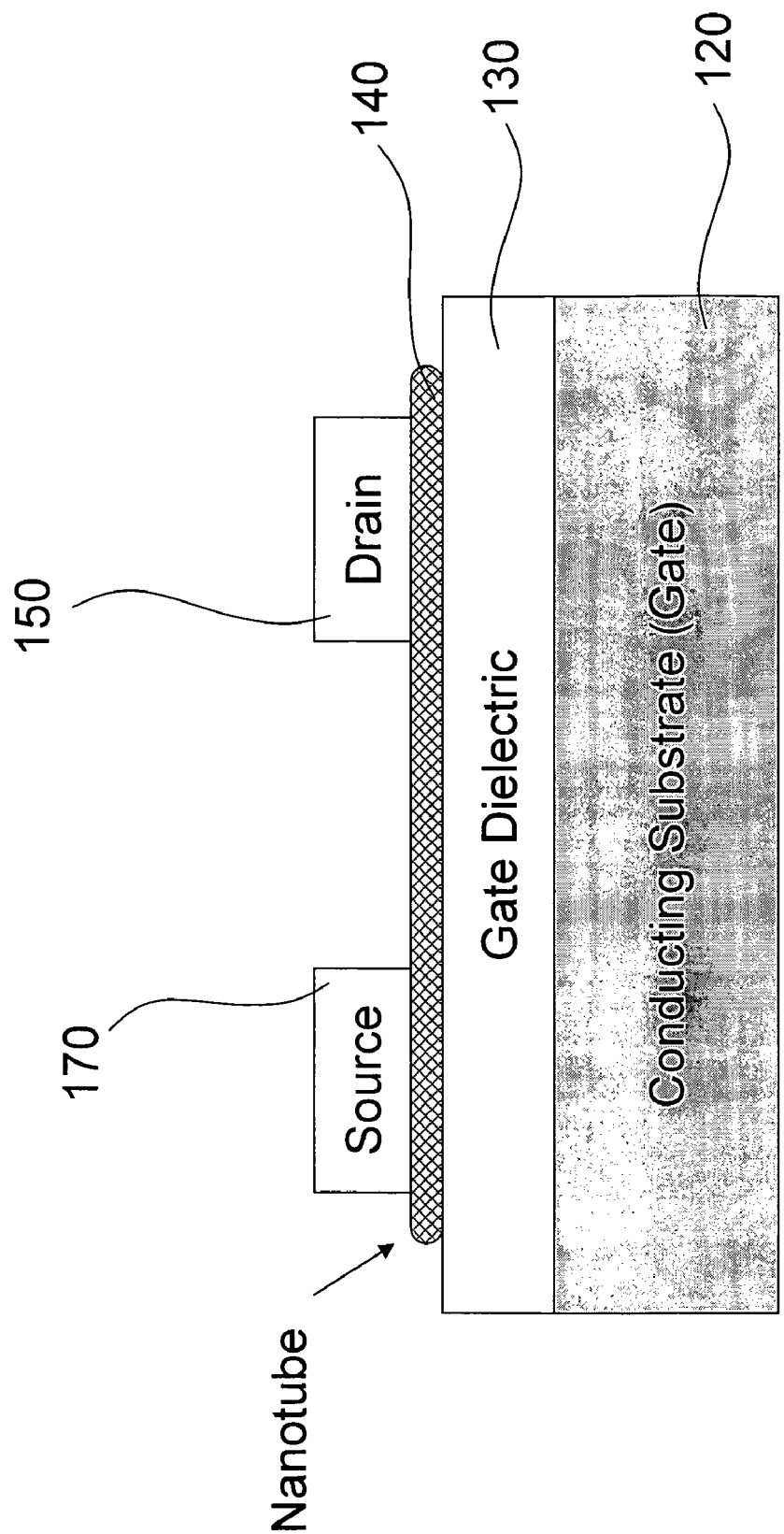
FIG. 1 illustrates a carbon nanotube field effect transistor using back-gated geometry.

FIG. 1 shows an embodiment of a carbon nanotube (CNT) field effect transistor (FET) 100. The CNT FET 100 incorporates a carbon nanotube 140 deposited on a gate dielectric layer 130, such as silicon dioxide ($SiO_2$). Gate dielectric layer 130 is grown or deposited on a conducting substrate 120, which functions as a gate electrode. The conducting substrate 120 may be silicon (Si) or another type of conducting material. The source electrode 170 and drain electrode 150 contacts are grown or deposited on the CNT 140. The CNT FET 100 shown in FIG. 1 is based on a back-gated geometry.

In operation, a voltage is applied across the source electrode 170 and the drain electrode 150. As a result, current flows from, for example, the source electrode 170 to the drain electrode 150 via the CNT 140. A voltage applied to the gate electrode 120 modulates the current flowing in the CNT 140. The back-gated CNT FET 100 configuration, formed by growing a nanotube 140 on oxidized, high conductivity wafers 130 and 120 (e.g., comprising Si), works well at direct current (DC) and at frequencies below 250 MHz. In a configuration of CNT FET 100, in which a conducting substrate (e.g., Si) acts as the gate 120, FET performance is limited due to large gate-source and gate-drain capacitances. The large parasitic capacitance between source 170 and gate 120 or drain 150 and gate 120 may limit the speed of the CNT FET 100.

Figure 2:
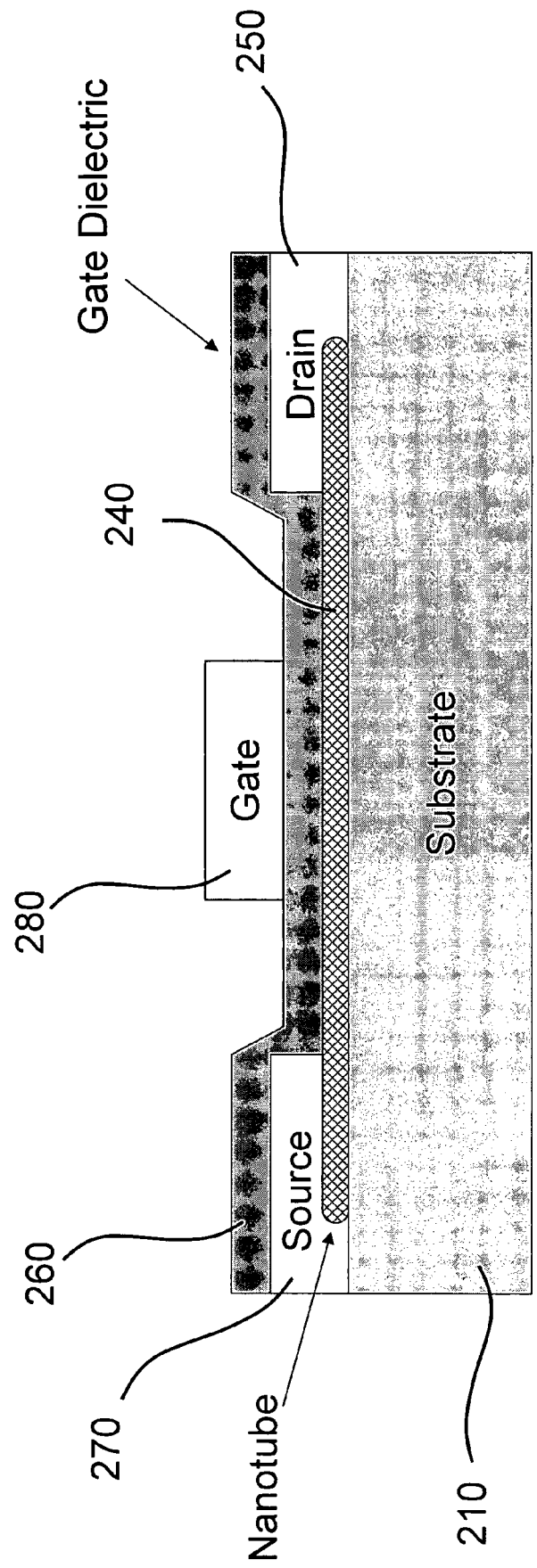
FIG. 2 illustrates a carbon nanotube field effect transistor using top-gated geometry.

FIG. 2 shows an embodiment of a high-speed CNT FET 200 incorporating a CNT 240 deposited on substrate 210. The substrate 210 may be an insulating substrate, such as quartz ($SiO_2$), or the substrate 210 may be a conducting substrate, such as Si. The substrate 210 may include materials with low RF losses such as sapphire ($Al_2O_3$), Galium Arsenide (GaAs), Silicon Carbide (SiC), high resistivity Si, alumina ($AlO_x$), glass, beryllia (BeO), titanium oxide (TiO2), ferrite, Teflon (a registered trademark of DuPont) (polytetrafluoroethylene), ceramic, plastic or any combination thereof. The source electrode 270 and drain electrode 250 are grown or deposited on the substrate 210. As shown, the source electrode 270 and drain electrode 250 are deposited on the substrate 210 so as to make contact with the CNT 240. The CNT 240 acts as a channel between the source electrode 270 and drain electrode 250, through which current flows. CNT FET 200 may use a single carbon nanotube molecule to form the channel between the source electrode 270 and drain electrode 250. CNT FET 200 may include one or more additional CNT molecules next to (e.g., side by side) CNT 240. The additional CNTs may be deposited on substrate 210 in any configuration, such as in parallel, stacked, crisscrossed, interweaved or any other configuration. If a plurality of CNTs are deposited, these may or may not make contact with one another. Depositing a plurality of CNTs 240 on substrate 210 will result in a wider channel between the source electrode 270 and drain electrode 250, causing, for example, a larger output current, increasing the transconductance of the device.

A gate dielectric 260 is deposited on CNT 240 (or additional CNTs). The gate dielectric 260 may also extend over the source 270 and the drain 250, as shown, or the gate dielectric 260 may only cover a portion of the CNT 240 in the region under the gate electrode 280. A gate 280 is deposited on the gate dielectric 260 above the CNT 240, as shown. The gate 280 may be deposited over all or a portion of the CNT 240. The gate 280 may extend over a small portion of the source electrode 270 or the drain electrode 250, but this will lead to reduced device performance. The CNT FET 200 shown in FIG. 2 is based on a top-gated geometry.

The gate dielectric 260 may comprise a plurality of materials, such as Titanium Oxide ($TiO_2$), Hafnium Oxide or Hafnia ($HfO_2$), Zirconium Oxide ($ZrO_2$), Barium Strontium Titanate ($BaSrTiO_3$), Aluminum Oxide or Alumina ($AlO_x$), Tantalum Oxide ($Ta_2O_5$), Aluminum Nitride (AlN), Silicon Nitride ($Si_3N_4$), Silicon Oxide ($SiO_x$) and/or combinations thereof. In one embodiment, the gate dielectric 260 may be 100 nm thick, or may range between 1 nm and 600 nm in thickness. The gate dielectric 260 may comprise a high κ (dielectric constant) dielectric material. For example κ for gate dielectric 260 may be greater than or equal to 15, or may range from 4 to 300. The high-κ dielectric gate oxides, such as $TiO_2$, $HfO_2$, $ZrO_2$, $Ta_2O_5$, and $BaSrTiO_3$, may be used to increase the device transconductance. Lower κ dielectrics (e.g., where κ is less than 15) may also be used. The thickness of the gate dielectric 260 can be varied (e.g., increased or decreased) to change, for example, the dielectric characteristics of the device. For example, if a lower κ dielectric is used, the thickness of the lower κ dielectric can be increased to change the characteristics of the device.

The top-gated geometry of CNT FET, such as CNT FET 200 shown in FIG. 2, can operate at high speeds. For example, CNT FET 200 can operate in the radio frequency (RF), microwave frequency, or millimeter-wave (mm-wave) ranges, and exhibits improved performance over conventional FETs. CNT FET 200 exhibits frequency independent performance for frequencies as high as 23 GHz. Calculations show that CNT FET 200 can operate at speeds in excess of 6 THz.

The top-gated device geometry of CNT FET 200 minimizes the gate-source and gate-drain capacitances, and maximizes the operating speed. In one embodiment, the CNT FET 200 is fabricated by growing single-walled carbon nanotubes on a substrate, such as quartz, using, for example, the chemical vapor deposition (CVD) technique. CVD may be used to deposit, for example, a 1.2 nm diameter nanotube(s) on RF compatible quartz substrates, which provide minimal losses at microwave frequencies. Source and drain contacts can be formed from, for example, a titanium/gold metal bi-layer, using a standard optical lithography lift-off process. Other possible contact metals include but are not limited to tungsten (W), titanium (Ti), platinum (Pt), gold (Au), silver (Ag), molybdenum (Mo), nickel (Ni), palladium (Pd), rhodium (Rh), niobium (Ni), aluminum (Al) and/or combinations thereof. The overall channel length of a CNT FET can be approximately 5 μm, with the gate covering about 1 μm. A 220 nm thick $Si_3N_4$ gate dielectric can be sputtered prior to the deposition of a niobium/aluminum gate electrode. The CNT FET device fabricated using the foregoing process produces an n-type depletion-mode CNT transistor.

In an embodiment, an input RF voltage ($V_g$) is applied to the gate electrode 280. A DC current is applied to the channel formed by CNT 240. The application of the RF voltage produces an output RF voltage ($V_{ds}$) between the source electrode 270 and the drain electrode 250. The top-gated CNT FET 200 configuration, formed by growing a nanotube 240 on an insulating substrate 210, works well at high frequencies. Thus, as the frequency of the RF input voltage, $V_g$ is increased, the CNT FET 200 maintains its performance, and provides a constant output, in some cases, up to frequencies of 6 THz. The configuration of CNT FET 200 minimizes the parasitic capacitance and conductive losses at high frequencies. In this geometry, the source/drain electrodes (270, 250) and the gate electrode (280) have no overlap, this results in parasitic capacitance that is reduced by several orders of magnitude. Use of insulating substrates, such as quartz, substantially reduces these losses in the microwave and mm-wave frequency ranges. In addition, quartz substrates are potentially less expensive and more readily available than other RF compatible substrates.

Figure 3:
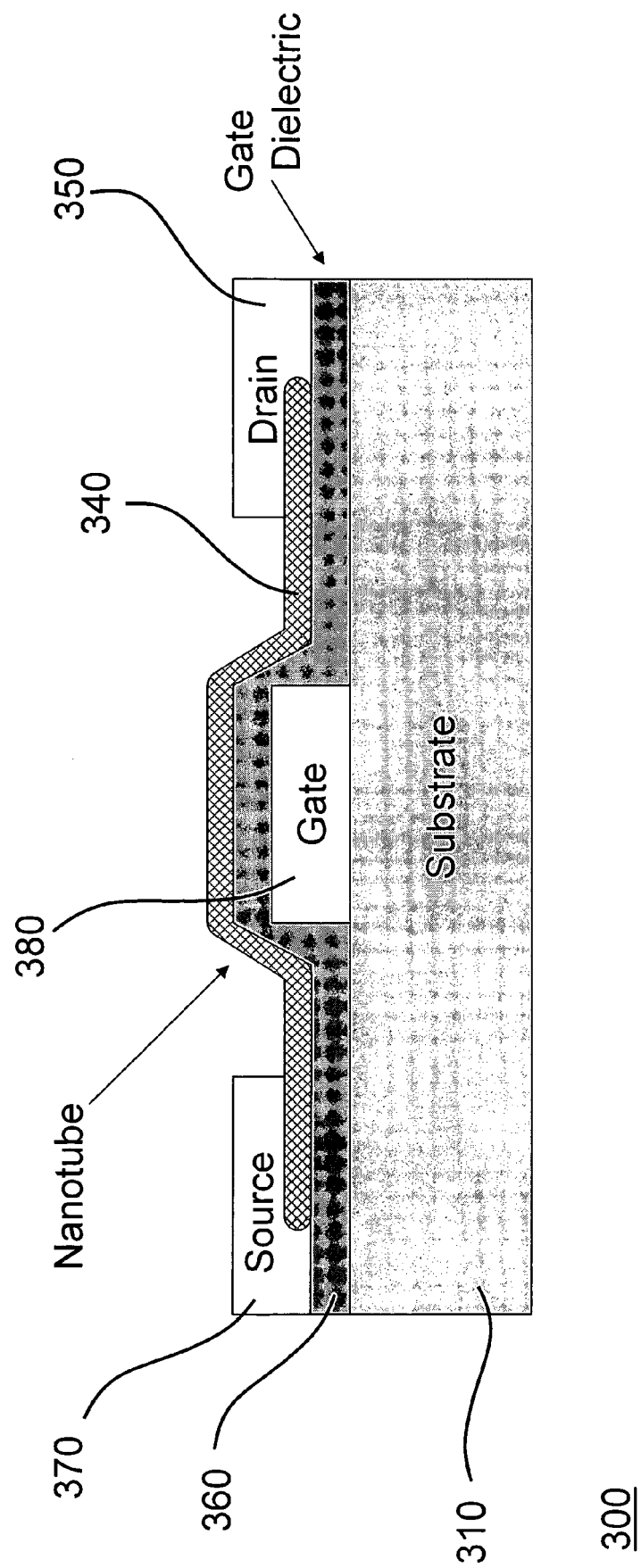
FIG. 3 illustrates an alternate design for a carbon nanotube field effect transistor using top-gated geometry.

FIG. 3 shows a top-gated CNT FET 300 fabricated in an inverted configuration. In an embodiment, the CNT FET 300 may provide identical or comparable performance as the CNT FET 200, shown in FIG. 2. In the configuration of CNT FET 300, a gate electrode 380 is first deposited on a substrate 310, such as quartz. The substrate 310 may be made from any of the RF compatible materials listed above. A gate dielectric 360 may be deposited only on the gate 380, on the gate 380 and a portion of the substrate 310, or on the gate 380 and the entire substrate 310 (as shown). A CNT 340 (or a plurality of CNTs) is then grown or deposited on the gate dielectric 360 across the gate 380. Source 370 and drain 350 contacts are deposited on the ends of the CNT 340. In operation, the CNT FET 300 provides constant performance at increased frequencies, and losses remain constant as frequency is increased (e.g., in the microwave and mm-wave input frequency ranges.

Figure 4:
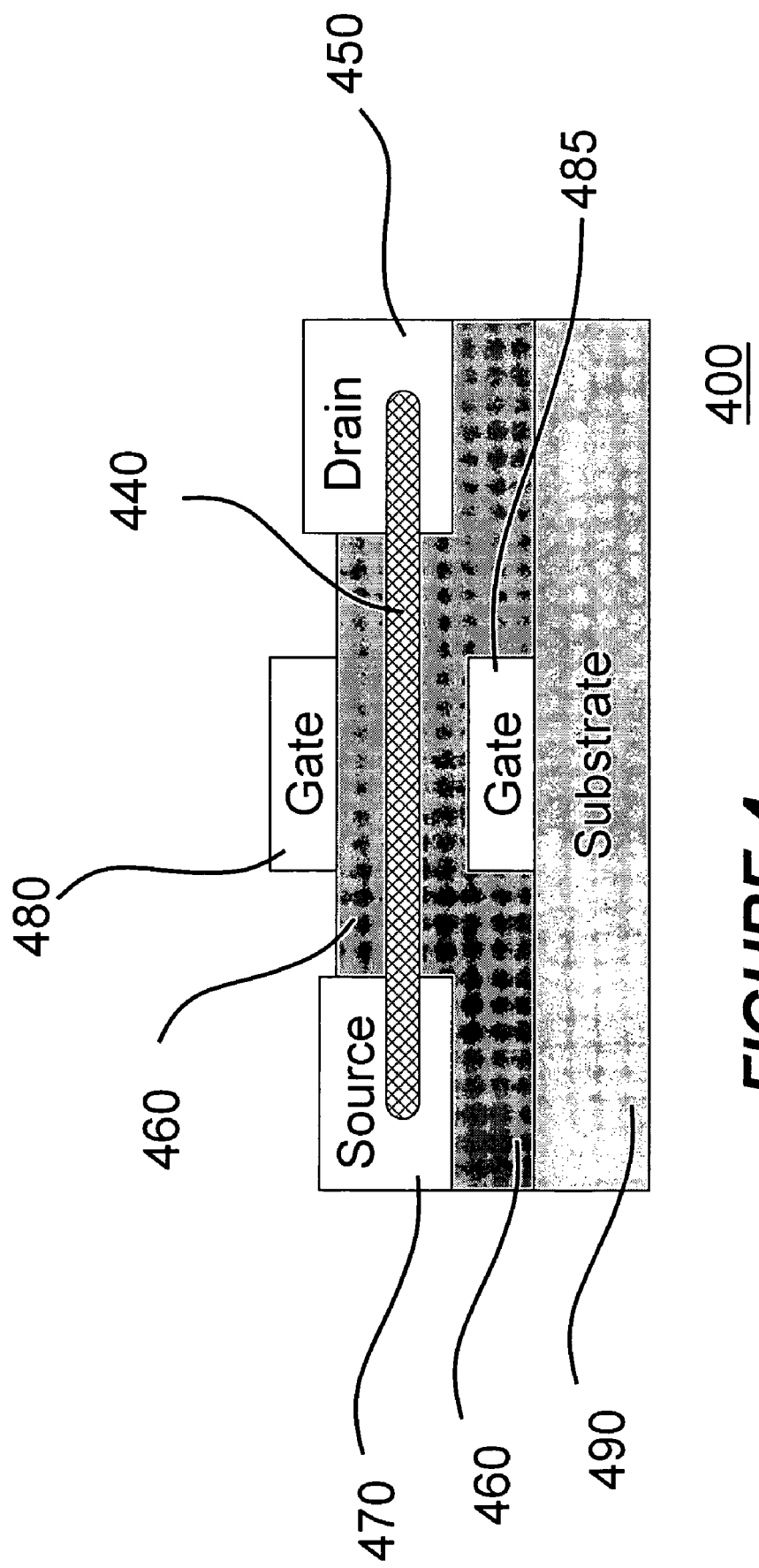
FIG. 4 illustrates another alternate design for a top-gated carbon nanotube field effect transistor.

FIG. 4 illustrates a CNT FET 400 in accordance with a variation of the top-gated geometry. In top-gated CNT FET 400, two separate gates 480 and 485 are used. Gate 480 lies above CNT 440 and gate 485 lies below CNT 440. Both gates 480 and 485 are separated from the CNT 440 by a gate dielectric 460. The dielectric 460, above and below the CNT 440, may be single dielectric or may be two separate dielectrics. The dielectrics may or may not be electrically coupled. The two gates 480 and 485 may or may not be electrically coupled. Electrical coupling may be physical coupling (direct contact), capacitive coupling and/or magnetic coupling. If the gates 480 and 485 are not coupled, the gates 480 and 485 may provide an AND gate, be used as a mixer or eliminate the need for chemical doping of the CNT 440. CNT FET 400 includes source 470, drain 450 and substrate 490. The various components of CNT FET 400, such as the substrate 490, gate 480, gate 485, gate dielectric 485, source 470, drain 450 and CNT 440, may be made from the various materials, processes, and in various sizes as described with respect to CNT FETs above. The CNT FET 400 may provide identical or comparable performance as the CNT FETs described herein. In operation, the CNT FET 400 may provide constant performance at increased frequencies, and losses remain constant as frequency is increased (e.g., in the microwave and mm-wave input frequency ranges.

Figure 5:
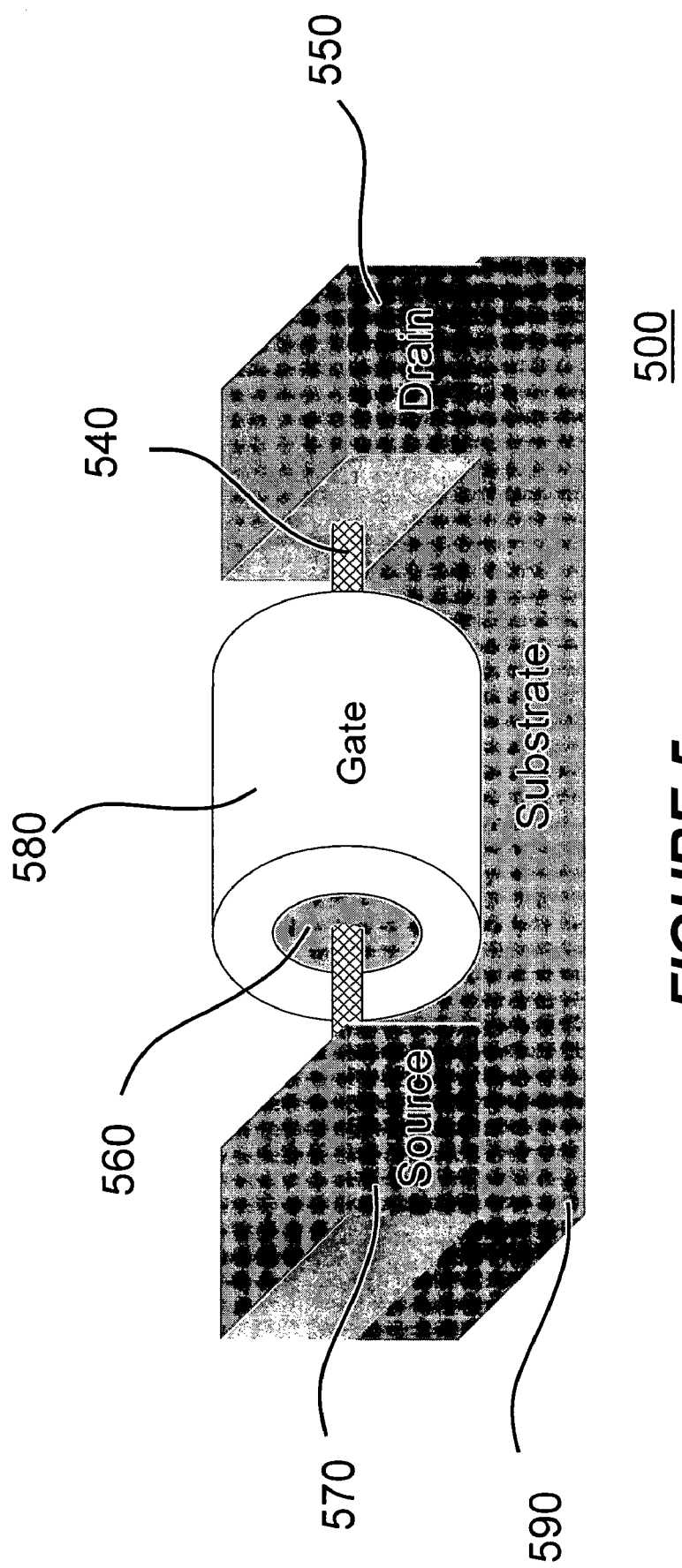
FIG. 5 illustrates another alternate design for a top-gated carbon nanotube field effect transistor.

FIG. 5 illustrates a CNT FET 500 in accordance with another variation of the top-gated geometry. In top-gated CNT FET 500, the gate 580 surrounds the CNT 540 but is separated from CNT 540 by a gate dielectric 560, as shown. CNT FET 500 includes source 570, drain 550 and substrate 590. The various components of CNT FET 500, such as substrate 590, gate 580, gate dielectric 560, source 570, drain 550 and CNT 540, may be made from the various materials, processes, and in various sizes as described with respect to CNT FETs herein. The CNT FET 500 may provide identical or comparable performance as the CNT FETs described herein. In operation, the CNT FET 500 may provide constant performance at increased frequencies, and losses remain constant as frequency is increased (e.g., in the microwave and mm-wave input frequency ranges.

In the various top-gated CNT FET geometries discussed herein, the high speed operation may be achieved by separating the gate(s), such as gate 280, 380, 480 and 485, or 580, away from both its respective source, such as source 270, 370, 470, or 570, and respective drain, such as drain 250, 350, 450, or 550, to minimize the parasitic capacitance.

The various top-gated CNT FET designs described herein (e.g., CNT FETs 100-500) may include additional metal, insulating, and/or semi-conducting layers deposited above or below the CNT FET to form other electronic structures such as but not limited to resistors, capacitors, diodes, or inductors. In addition, the substrate for the CNT FET could be replaced with an integrated circuit manufactured from a different IC technology such as Silicon (Si), Galium Arsenide (GaAs), Silicon Germanium (SiGe), Silicon Carbide (SiC), Galium Nitride (GaN) or other materials, or combination thereof. For example, the substrate 210 for CNT FET 200 may be a GaAs substrate on which GaAs Metal-Semiconductor Field Effect Transistors (MESFET) have been fabricated, and to which the CNT FET 200 is electrically connected. This configuration could be applied to any of the CNT FETs 200-500, and could also be applied to CNT FET 100.

As described above, the process for fabricating a CNT FET, such as CNT FETs 200-500, may include the features designed to maximize the operating frequency. For example, the CNT FET devices may be grown on insulating substrates to minimize losses; the top-gated geometry may be chosen to minimize parasitic capacitance; and a thin, high-κ gate dielectric may be chosen to maximize the device transconductance.

The carrier mobility in semi-conducting CNTs can exceed 100,000 cm$^2$V·s at room temperature. An estimate of the cutoff frequency, $f_T$, for a high-speed FET is given by the ratio of the transconductance, $g_m$, to the gate-source capacitance $C_{gs}$. Thus, $f_T = g_m/2\pi C_{gs}$. Theoretically, the maximum transconductance for a nanotube device is 155 micro-siemens (μS). The highest reported transconductance for nanotube devices is currently an order of magnitude lower, about 20 μS, for back-gated nanotube FETs. Top-gated FETs may have a higher transconductance. The gate-source capacitance, $C_{gs}$, is about 3 aF for a 100 nm gate length. Using the lower estimate of $g_m = 20$ μS, the cutoff frequency for a CNT FET is about 1 THz. Thus, based on this calculation, FETs such as CNT FETs 200-500 will be useful in high frequency RF, microwave, and mm-wave systems.

Figure 6:
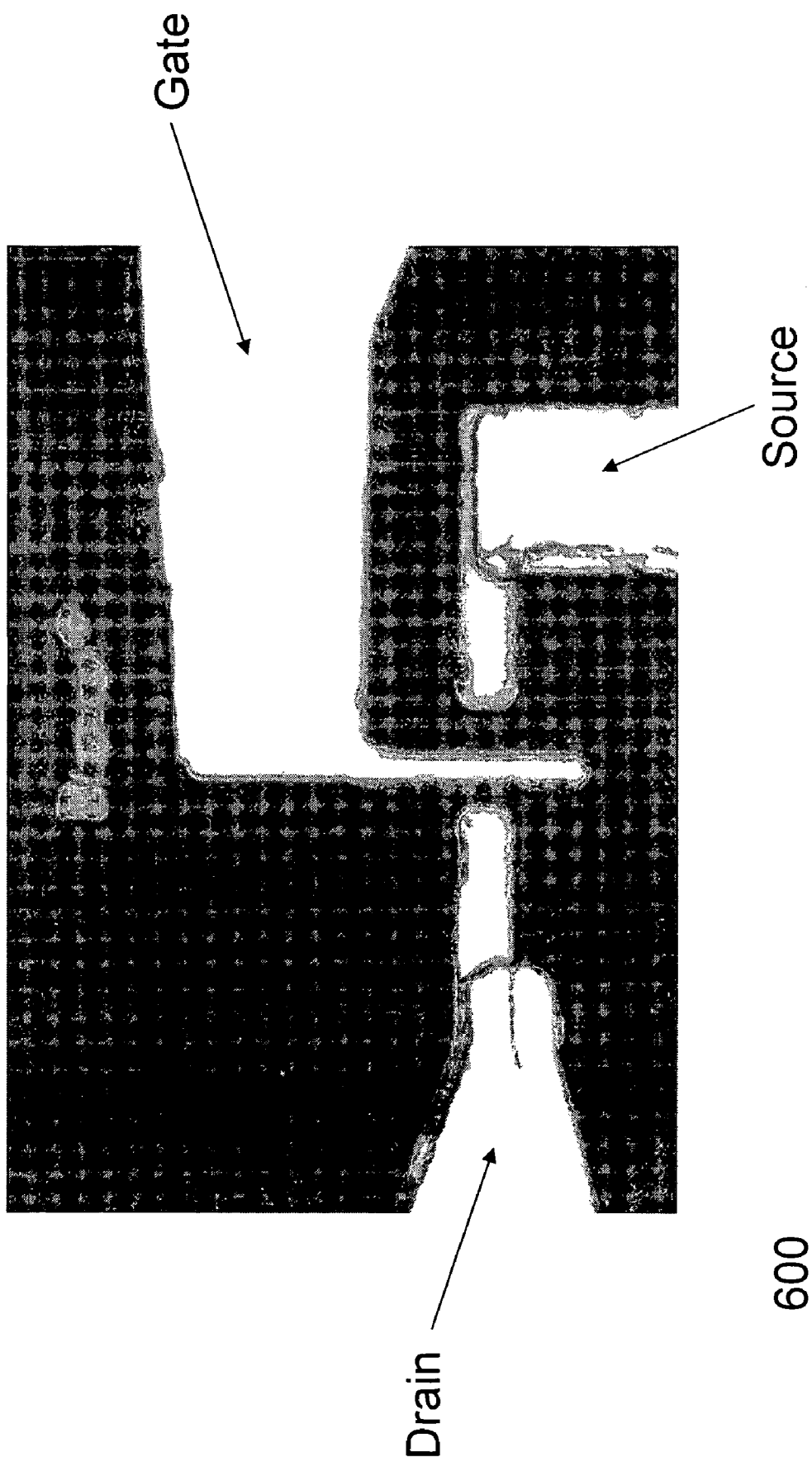
FIG. 6 is an optical micrograph of an embodiment of a top-gated carbon nanotube field effect transistor.

FIG. 6 shows is a optical micrograph 600 of an embodiment of the top-gated CNT FET 200 (also referred to as CNT FET 600). The CNT FET 600 shown was fabricated by growing a single CNT on a quartz substrate. Titanium (Ti)/Gold (Au) source and drain electrodes were deposited on the CNT with a 5 μm gap to form a 5 μm channel. A 220 nm thick $Si_3N_4$ gate dielectric was deposited on the nanotube. A 1 μm wide gate made of Aluminum (Al)/Niobium (Nb) was deposited on the gate dielectric above the CNT. The device thus fabricated was found to be an n-type depletion mode device.

Figure 7:
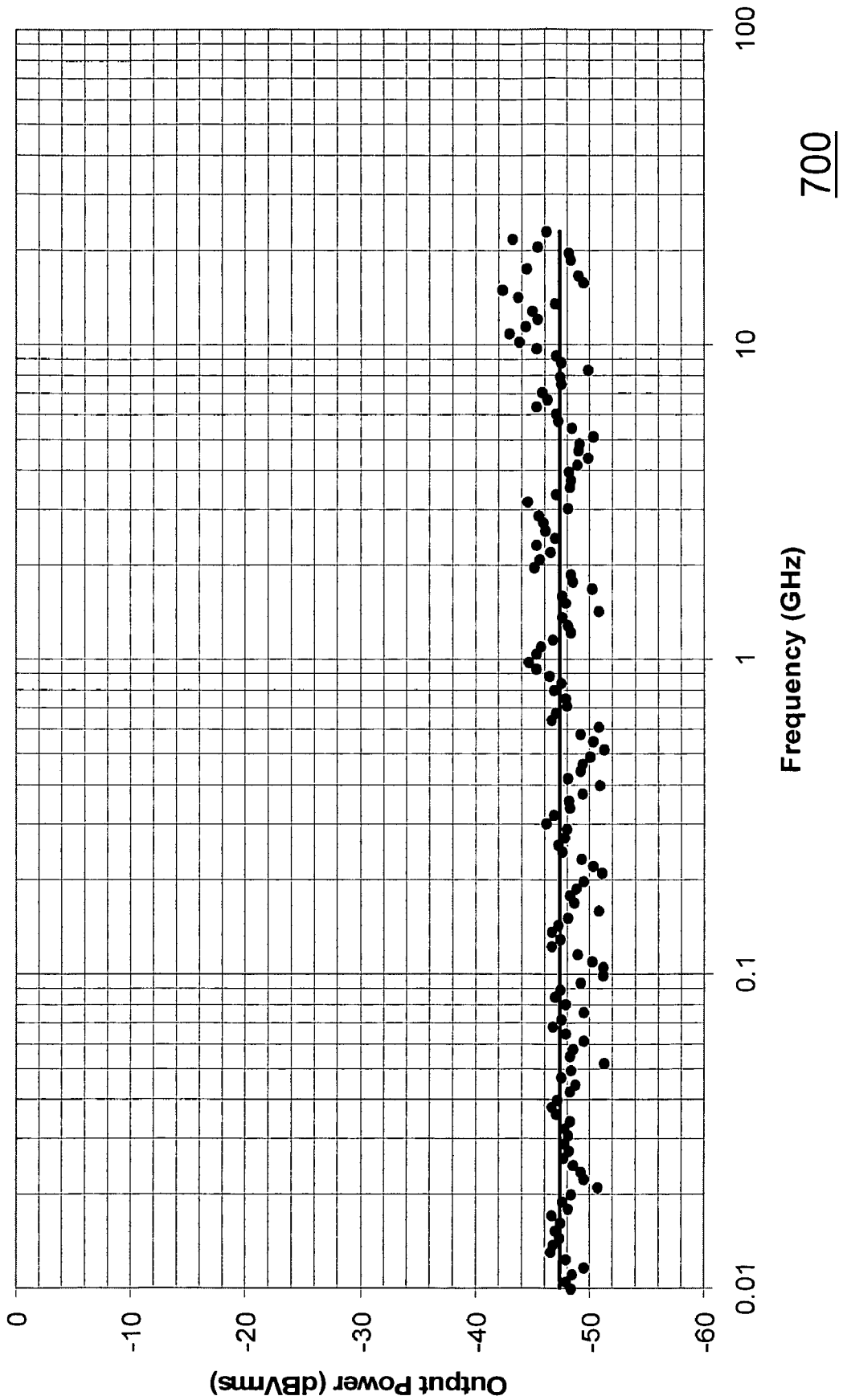
FIG. 7 is a plot of the measured power output over frequency of the top-gated carbon nanotube field effect transistor shown in FIG. 4.

FIG. 7 is a graph 700 showing the measured output power (dBVrms) generated from the top-gated high speed CNT FET 600 as the input frequency is increased. Graph 700 illustrates that top-gated CNT FETs are capable of operating at frequencies up to 23 GHz. Because of technical challenges involved in measuring a device with such a low transconductance, the device was configured as a mixer and the output signal was measured at 10 kHz. As can be seen in FIG. 7, the performance of the CNT FETs, as described herein, does not degrade as the frequency increases to 23 GHz. The 23 GHz limit is not a limit of the useful frequency range of the device, but rater a limitation of the measurement apparatus used to measure the device. Calculations further show that the output performance of CNT FET 600 is constant up to 150 GHz.

In an embodiment of the CNT FETs, as described herein, the transconductance of the device can be improved by making the channel length small compared to the mean free path of carriers in the CNT, typically about 700 nm. The mean free path of the carriers in the CNT is determined by the scattering of acoustic phonons. If the channel is made sufficiently short, the carriers can not scatter acoustic phonons and will travel ballistically from source to drain (or from drain to source). When ballistic transport occurs, no energy is lost during the transit from source to drain (or drain to source) and the transconductance is increased, resulting in constant performance by the CNT FET at increased frequencies.

The CNT FET, as described herein, may exhibit highly linear characteristics due to the configurations of the CNT FET, the size of the various CNT FET components, the materials used to manufacture the CNT FET and/or the bias voltages applied to the circuits. The CNT FET may exhibit device characteristics of highly linear devices. When configured as described, the linearity of the device becomes independent of the bias conditions over a large range of source-drain voltages and gate voltages. To achieve these highly linear results: the drain-source bias of the CNT FET is sufficiently small, the contacts are ohmic and/or the gate dielectric has a sufficiently high dielectric constant. If these conditions are met, the CNT FET may operate in a non-standard mode in which the transconductance of the device is nearly independent of the gate and source-drain bias voltages, resulting in very high linearity.

Because carbon nanotubes are only a few nanometers in diameter and a typical CNT FET is only a few μm long, the electronic states in a CNT do not form a band structure like that found in other semiconductors such as Si. In the direction parallel to the nanotube axis (i.e., the channel length), the electronic states almost form a band in which each state is separated by an energy of about 4 meV. However, in directions perpendicular to nanotube axis (i.e., the channel width) the electronic states are discrete states similar to those found in a single molecule with energy differences of several hundred meV. As a result, at low energy scales, the CNT may behave as a one-dimensional conductor.

The performance characteristics of a CNT FET may be improved by controlling the drain-source bias voltage. At high drain-source bias voltages, the velocity of the carriers in the channel, (e.g., channel 140, 240, 340, 440 or 540), is determined by the saturated velocity that results from optical phonon emission. When the drain-source voltage is above a critical value, typically about 160 mV, the carriers traveling down the channel have, with high probability, sufficient energy to generate an optical phonon. When the optical phonon is created, the energy of the carrier is decreased by a fixed amount, typically about 160 meV. Thus, the carrier velocity is reduced by the phonon emission. If the energy of the carrier is still above the critical value, additional optical phonons will be created until the energy drops below the critical value. For low source-drain voltages, the carrier velocity will be determined by the electronic band structure of the CNT. At high source-drain bias voltages, the carrier velocity will saturate as a result of optical phonon emission. Thus, biasing the voltage across drain (e.g., 150, 250, 350, 450 or 550) and source (e.g., 170, 270, 370, 470 or 570) below the critical voltage at which optical phonons are created improves both the transconductance and linearity of the device.

In an embodiment, Ohmic contacts may be provided to the source electrode and drain electrode of the CNT FET. The Ohmic contacts on the CNT FET may be sputtered, evaporated or deposited metal pads that are patterned using photolithography or other techniques. Ohmic contacts are created by using a metal with a work function similar to the work function of the carbon nanotube. Metals such as palladium or rhodium may be used for the Ohmic contacts. Contacts may also be formed using an alloy made of one or more metals with a high work function and one or more metals with a low work function mixed in the proper ratio to produce an alloy with a work function similar to that of the carbon nanotube. When the work function of the metal contact differs from that of the carbon nanotube, a Schottky barrier is formed. Carriers entering or leaving the nanotube must cross this barrier and lose energy in the process. When a metal with the proper work function is chosen, no Schottky barrier exists, i.e. the contact is Ohmic, and the carrier velocity is determined by the band structure of the carbon nanotube. Ohmic contacts will thus improve the transconductance and linearity of the CNT FET.

Additional performance improvements of the CNT FET may be achieved by decreasing the thickness of the gate dielectric, or by increasing the dielectric constant, $\kappa$, of gate dielectric. As described below, increasing the gate-channel capacitance of a CNT FET may result in the charge in the CNT channel being determined by the CNT band structure which may improve the linearity and transconductance. Dielectric materials such as $Ta_2O_5$, $ZrO_2$, $HfO_2$, $TiO_2$, $BaSrTiO_3$ or other high-$\kappa$ dielectric material may be used. As used herein, the definition of high-$\kappa$ is dependent upon the thickness of the dielectric. For example, high-$\kappa$ is $\kappa$ greater than 4 for dielectrics less than 3 nm thick, $\kappa$ greater than 7 for dielectrics between 3 nm and 30 nm thick, and $\kappa$ greater than 15 for dielectrics over 15 nm thick. Using a high-$\kappa$ dielectric of appropriate thickness can achieve improved performance.

Biasing the gate of a CNT FET adds charge to the channel which increases the energy of the system in two ways. First, energy is stored in the electric field in the gate dielectric of the CNT FET. This is the ordinary electrostatic capacitor formed between the gate and channel. Second, the addition of charge to the channel increases the Fermi energy of the carriers in the channel. In ordinary two and three dimensional devices, the density of states is so high that the change in the Fermi energy involved in adding an additional charge is negligible, typically less than 100 peV. However, in the CNT FET, as described herein, the electronic states may be spread apart and the addition of a single charge can significantly increase the Fermi energy, typically about 4 meV. If the energy in the electric field can be made sufficiently small, the amount of charge in the channel will be determined by the electronic band structure. Since the energy in the electric field is $q^2/2C$, this energy is minimized by making the capacitance, C, large. Typically, the capacitance is made large by making the gate dielectric thin. Thinning the gate dielectric of the CNT FET will increase the gate-channel capacitance, but, since the CNT has such a small diameter, typically about 1 nm, changing the dielectric thickness has a small effect on the total capacitance. However, the capacitance is directly proportional to the dielectric constant, $\kappa$. Thus using a high-$\kappa$ dielectric will increase the gate-channel capacitance and minimize the energy in the electric field. As a result, the charge in the channel will be determined by the band structure of the CNT rather than the electrostatic capacitance, increasing transconductance of the device and improving device linearity.

Figure 8:
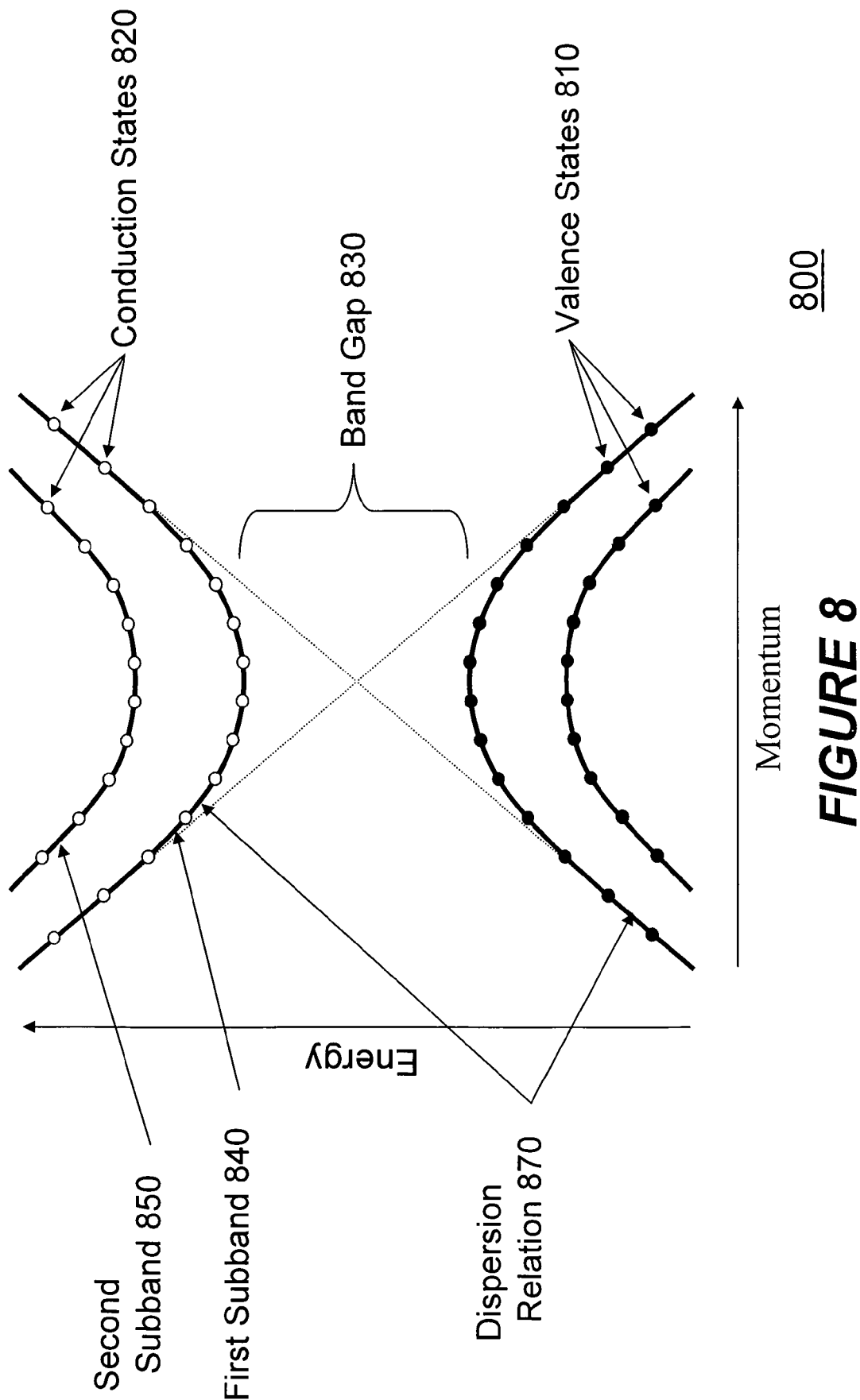
FIG. 8 illustrates an electronic band structure for a carbon nanotube.

FIG. 8 is an illustration of the band structure of a CNT, which shows the energy of an electronic state versus its momentum in the direction of the axis of the CNT. The circles represent the individual electron states, with open circles corresponding to conduction states 820 and filled circles corresponding to valence states 810. The difference in energy of the lowest conduction state and highest valence state is the band gap 830, typically several hundred meV. Although the individual electron states are separated in energy by about 4 meV, they follow a well defined energy-momenta curve, known as a dispersion relation 870, indicated by the lines. There are several different dispersion relations 870, corresponding to different momentum in directions perpendicular to the axis of the CNT. The dispersion relation curves 870 with zero transverse momentum, i.e. the curves closest to the band gap, correspond to the first sub-band 840. Those with the second lowest transverse momentum correspond to the second sub-band 850. Typically individual sub-bands are separated by a couple hundred meV.

When a CNT FET is fabricated with ohmic source contacts and drain contacts, and is operated with a sufficiently small source-drain bias voltage, the velocity of the carriers (electrons or holes) will be determined by dispersion relation 870. Under these circumstances, the carrier velocity will be proportional to the slope of the dispersion curve 870. When a CNT FET is manufactured with a thin, high-$\kappa$ gate dielectric, the number of carriers in the channel will be determined by the dispersion relation 870. Under these circumstances, the number of carriers will be inversely proportional to the slope of the dispersion curve 870. The total current in the CNT is the number of carriers times the velocity of the carriers. When these listed conditions are met simultaneously, the channel current will be independent of the slope of the dispersion curve. The transconductance will thus be independent of the bias conditions, and the device will be highly linear.

To achieve the high linearity discussed above, it is not necessary that the channel be made from a CNT. Other semiconductor materials including but not limited to Si, Germanium (Ge), SiGe, GaAs, GaN, SiC, Boron Nitride (BN), Indium Arsenide (InAs) and/or Indium Phosphide (InP) can be used so long as the separation of the individual sub-bands is large relative to the available thermal energy. Since the available thermal energy is typically on the order of 25 meV at room temperature, meeting this criterion requires that the channel be no more than 3 nm wide (in the direction perpendicular to current flow).

One or more CNT FETs, as described herein, can be used in electronic devices, such as diodes and transistors in both analog and digital circuitry, in high speed circuits and/or used in high-radiation environments that operate in a high-radiation environment. High-radiation environments provide significant risks to circuitry, and pose interesting circuit design challenges. One risk is total dose effects, which occurs when ionizing radiation produces trapped charge in the gate and field oxides. The charge trapped in the gate oxide can shift the threshold of the device, while the charge trapped in the field oxide can result in leakage currents between devices or between the device and substrate. These total dose effects, if significant, can render the device useless. Another risk is the displacement damage that occurs when high energy particles such as protons or neutrons displace atoms from within the channel of the FET, such as a Si FET. Since Si FETs are majority carrier devices, displacement damage usually results in a gradual degradation of the on-state current. Additional risks to electronic circuitry can be created by current transients and latch-up, caused by highly ionizing radiation such as cosmic rays or heavy ions. Current transients occur when ionizing radiation crosses the FET channel producing free carriers in the channel, that can result in a spike in the FET source-drain current. Latch-up occurs when ionizing radiation passes through the region between two complimentary FETs. The radiation produces an unintended channel between the FETs causing both FETs to turn on and maintain the channel long after the radiation event has ended.

A CNT FET can be radiation hardened, in accordance with an embodiment of the invention. Due to their configuration, and small size, the CNT FET are highly resistant to total dose effects and current transients. Additionally, the CNT FET may be configured to minimize the risks associated with, for example, total dose effects, displacement damage, and current transients and latch-up, that can occur in high-radiation environments. In an embodiment, the substrate for the CNT FET may be replaced with substrates that are less prone to charge trapping. Such radiation hardened substrates include GaAs, Sapphire, Si, $SiO_x$, InP, GaN, AlN, SiC, and/or Diamond. These substrates may reduce or may eliminate trapped charge thus minimizing the total dose effects. Moreover, the use of insulating substrates in the CNT FET minimizes or may even eliminate latch-up because the parasitic channels required for latch-up can only occur in semiconducting substrates.

In an embodiment, the gate dielectric of the CNT FET or substrate of the CNT FET may be replaced with a dielectric that is less prone to charge trapping. Such radiation hardened gate dielectrics include $Si_3N_4$, GaAs, $Si_3N_4$, AlN, $SiO_x$, $AlO_x$ and/or $Ta_2O_5$. These dielectrics can reduce or may eliminate trapped charge thus minimizing the total dose effects.

The CNT FET may be further radiation hardened by thinning the dielectric layer to minimize the total dose effects of the ionizing radiation. An extremely thin dielectric layer may result in less charge being generated in the dielectric region than using thicker dielectric layers. For example, the dielectric layer may be in the range of 1 to 10 nm in thickness. In addition, the small size configuration of the CNT FET may also minimize the total dose effects, displacement damage, current transients, and latch-up.

Figure 9:
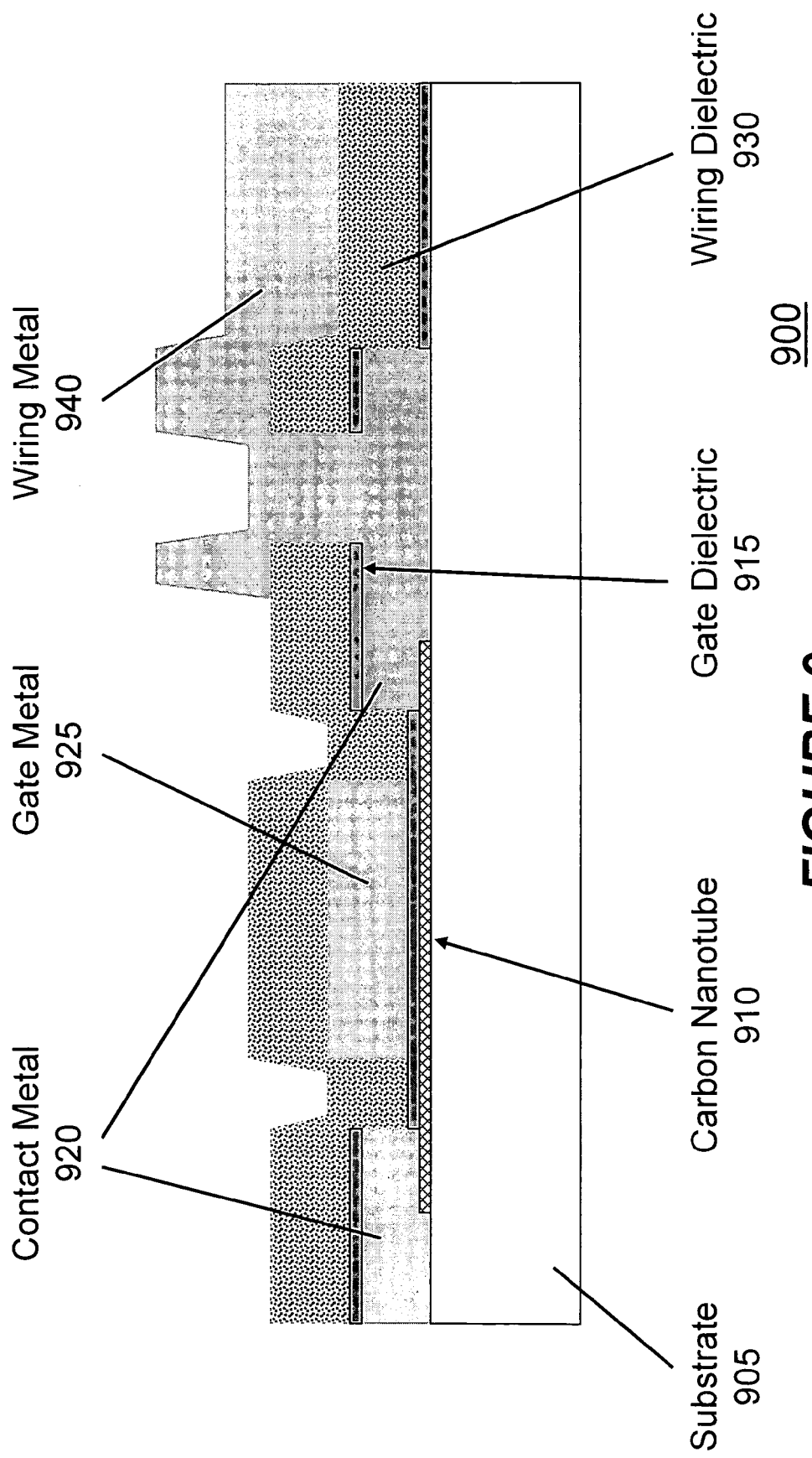
FIG. 9 illustrates an example of a fabrication process for a carbon nanotube field effect transistor.

FIG. 9 illustrates an example of a fabrication process for a CNT FET 900 in accordance with an embodiment. As shown, a CNT (or CNTs) 910 is deposited or grown on a substrate 905. The substrate 905 may be silicon, quartz, sapphire, gallium arsenide, silicon carbide, alumina, glass, beryllia, titanium oxide, ferrite, Teflon (a registered trademark of DuPont), ceramic, or another type of substrate. A metal contact layer 920 is deposited on a portion of the CNT 910 and substrate 905. The metal layers in this process can be made of tungsten, titanium, platinum, gold, silver, molybdenum nickel, palladium, rhodium, niobium, aluminum or other suitable metals. A gate dielectric 915 is deposited on the metal contacts 920 and the CNT 910, as shown. The gate dielectric 915 may also be deposited on a portion of the substrate 905. Gate metal 925 is deposited on the gate dielectric 915 above a portion of the CNT 910 to form the gate of the CNT FET, or above a portion of the contact metal 920 to form capacitors. A wiring dielectric 930 is deposited above the contact metal 920, gate metal 925, and gate dielectric 915. A wiring metal layer 940 is deposited above the wiring dielectric 930 and can contact the gate metal 925 and contact metal 920 through holes etched in the wiring dielectric 930 and gated dielectric 915. FIG. 9 described just one process that may be used to fabricate a CNT FET, however any other fabrication process can be used to fabricate the various CNT FETs as described herein.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

What is claimed is:

1. A linear carbon nanotube field effect transistor comprising:
    a substrate;
    a source electrode;
    a drain electrode;
    a carbon nanotube, wherein the carbon nanotube forms a channel between the source electrode and the drain electrode;
    a gate dielectric, wherein the gate dielectric has a dielectric constant κ that is greater than or equal to 15 for dielectrics over 30 nm thick, a dielectric constant that is greater than or equal to 7 for dielectrics between 3 nm and 30 nm in thickness, or a dielectric constant greater than or equal to 4 for dielectrics under 3 nm thick; and
    a gate electrode separated from the carbon nanotube by the gate dielectric, wherein an input radio frequency voltage is applied to the gate electrode,
    wherein the substrate comprises quartz.

2. The carbon nanotube field effect transistor of claim 1, wherein the gate electrode is positioned not to overlap any portion of the source or drain electrodes, and forms a top-gated geometry.

3. The carbon nanotube field effect transistor of claim 1, wherein a DC current flows through the channel formed by the carbon nanotube and the input radio frequency voltage applied to the gate electrode produces an output radio frequency voltage between the source electrode and drain electrode.

4. The carbon nanotube field effect transistor of claim 1, wherein a DC voltage is applied between the source electrode and drain electrode and the input radio frequency voltage applied to the gate electrode produces an output radio frequency current that flows through the channel formed by the carbon nanotube.

5. The carbon nanotube field effect transistor of claim 1, wherein one or both of the drain electrode and the source electrode include ohmic contacts.

6. The carbon nanotube field effect transistor of claim 1, further comprising:
    a bias voltage, wherein the bias voltage is applied between the drain and source electrodes below a voltage level where optical phonons are generated in the channel formed by the carbon nanotube.

7. The carbon nanotube field effect transistor of claim 1, wherein the gate dielectric is selected from a group comprising $TiO_2$, $HfO_2$, $AlO_x$, AlN, $Ta_2O_5$, $ZrO_2$, or $BaSrTiO_3$.

8. The carbon nanotube field effect transistor of claim 1, wherein the input radio frequency voltage ranges from 200 MHz to 6 THz.

9. A linear carbon nanotube field effect transistor comprising:
    a substrate;
    a source electrode;
    a drain electrode;

a carbon nanotube, wherein the carbon nanotube forms a channel between the source electrode and the drain electrode;

a gate dielectric, wherein the gate dielectric has a dielectric constant κ that is greater than or equal to 15 for dielectrics over 30 nm thick, a dielectric constant that is greater than or equal to 7 for dielectrics between 3 nm and 30 nm in thickness, or a dielectric constant greater than or equal to 4 for dielectrics under 3 nm thick; and a gate electrode separated from the carbon nanotube by the gate dielectric, wherein an input radio frequency voltage is applied to the gate electrode, wherein the substrate is selected from a group comprising sapphire, GaAs, SiC, high resistivity Si, alumina, polytetrafluroethylene, plastic, glass, beryllia, $TiO_2$, ferrite or ceramic.

10. A carbon nanotube field effect transistor, comprising:
a substrate;
a source electrode;
a drain electrode;
a carbon nanotube, wherein the carbon nanotube forms a channel between the source electrode and the drain electrode;
a first gate dielectric, wherein the carbon nanotube is deposited over a portion of the gate dielectric; and
a first gate electrode, wherein the gate dielectric is deposited over the first gate electrode, and the first gate electrode is separated from the carbon nanotube by the gate dielectric;
a second dielectric deposited on the carbon nanotube;
a second gate electrode, wherein the second gate electrode is deposited on the second gate dielectric and is separated from the carbon nanotube by the second gate dielectric,
wherein the first gate electrode and the second gate electrode are positioned not to overlap the source or drain electrodes.

11. A carbon nanotube field effect transistor, comprising:
a substrate;
a source electrode;
a drain electrode;
a carbon nanotube, wherein the carbon nanotube forms a channel between the source electrode and the drain electrode;
a first gate dielectric, wherein the carbon nanotube is deposited over a portion of the gate dielectric; and
a first gate electrode, wherein the gate dielectric is deposited over the first gate electrode, and the first gate electrode is separated from the carbon nanotube by the gate dielectric;
a second dielectric deposited on the carbon nanotube;
a second gate electrode, wherein the second gate electrode is deposited on the second gate dielectric and is separated from the carbon nanotube by the second gate dielectric,
wherein the first gate electrode is positioned not to overlap the source or drain electrodes.

12. The carbon nanotube field effect transistor of claim 11, wherein an input radio frequency voltage is applied to one or both of the first gate electrode and the second gate electrode.

13. The carbon nanotube field effect transistor of claim 11, wherein the second gate electrode is positioned not to overlap the source or drain electrodes.

14. A carbon nanotube field effect transistor, comprising:
a substrate;
a source electrode;
a drain electrode;
a carbon nanotube, wherein the carbon nanotube forms a channel between the source electrode and the drain electrode;
a first gate dielectric, wherein the carbon nanotube is deposited over a portion of the gate dielectric; and
a first gate electrode, wherein the gate dielectric is deposited over the first gate electrode, and the first gate electrode is separated from the carbon nanotube by the gate dielectric;
a second dielectric deposited on the carbon nanotube;
a second gate electrode, wherein the second gate electrode is deposited on the second gate dielectric and is separated from the carbon nanotube by the second gate dielectric,
wherein the first gate electrode and second gate electrode are coupled to surround a portion of the carbon nanotube and are separated from the portion of the carbon nanotube by the first and second gate dielectrics.

15. The carbon nanotube field effect transistor of claim 14, wherein the first and second dielectrics comprise a single dielectric.

* * * * *